United States Patent
Gohara et al.

(10) Patent No.: US 10,234,914 B2
(45) Date of Patent: *Mar. 19, 2019

(54) MOTOR DRIVING CIRCUIT, COOLING APPARATUS AND ELECTRONIC DEVICE USING THE SAME

(71) Applicant: ROHM CO., LTD., Ukyo-Ku, Kyoto (JP)

(72) Inventors: Yuki Gohara, Kyoto (JP); Tomofumi Mishima, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 132 days.

This patent is subject to a terminal disclaimer.

(21) Appl. No.: 14/703,324

(22) Filed: May 4, 2015

(65) Prior Publication Data

US 2015/0326153 A1    Nov. 12, 2015

(30) Foreign Application Priority Data

May 7, 2014  (JP) ................................ 2014-096314

(51) Int. Cl.
| | | |
|---|---|---|
| H02P 7/29 | (2016.01) | |
| G06F 1/20 | (2006.01) | |
| H02P 6/00 | (2016.01) | |
| H05K 7/20 | (2006.01) | |

(52) U.S. Cl.
CPC ............... *G06F 1/20* (2013.01); *H02P 6/002* (2013.01); *H02P 7/29* (2013.01); *H05K 7/20136* (2013.01); *H05K 7/20209* (2013.01)

(58) Field of Classification Search
CPC ... H02P 7/29; H02P 6/002; G06F 1/20; H05K 7/20209; H05K 7/20136

USPC ....................................................... 318/400.2
See application file for complete search history.

(56) References Cited

U.S. PATENT DOCUMENTS

| | | | | |
|---|---|---|---|---|
| 8,466,644 B2* | 6/2013 | Shimizu | .................. | H02P 6/085 |
| | | | | 128/204.18 |
| 8,653,774 B2* | 2/2014 | Shimizu | .................... | H02P 6/16 |
| | | | | 318/400.01 |
| 9,178,453 B2* | 11/2015 | Suzuki | ..................... | H02P 6/182 |
| 2003/0095013 A1* | 5/2003 | Melanson | ........... | H02M 3/1584 |
| | | | | 332/109 |
| 2003/0123178 A1* | 7/2003 | Gotou | ....................... | H02P 6/22 |
| | | | | 318/400.11 |

(Continued)

*Primary Examiner* — Eduardo Colon Santana
*Assistant Examiner* — Devon Joseph
(74) *Attorney, Agent, or Firm* — Cantor Colburn LLP

(57) ABSTRACT

A driving circuit of an electric motor includes: a PWM input pin for externally receiving an input pulse modulation signal with an input duty cycle; a duty cycle to digital converter for receiving and converting the input pulse modulation signal into a first digital value; a slope setting pin for receiving information indicative of a slope of an output duty cycle corresponding to the input duty cycle; a slope acquisition unit for acquiring a second digital value corresponding to the information indicative of the slope; a duty cycle computation unit for generating a linearly increased duty cycle instruction value corresponding to the first digital value by referring to the slope; a digital pulse width modulator for generating a controlling pulse having the output duty cycle corresponding to the duty cycle instruction value; and an output circuit for driving the electric fan motor in accordance with the controlling pulse.

15 Claims, 12 Drawing Sheets

(56) References Cited

U.S. PATENT DOCUMENTS

| | | | |
|---|---|---|---|
| 2006/0208675 A1* | 9/2006 | Alberkrack | H02P 6/16 318/400.04 |
| 2009/0184672 A1* | 7/2009 | Suzuki | H02P 6/085 318/400.13 |
| 2010/0164581 A1* | 7/2010 | Zhang | H02P 6/085 327/175 |
| 2011/0234129 A1* | 9/2011 | Shimizu | H02P 6/085 318/400.04 |
| 2011/0279072 A1* | 11/2011 | Shimizu | H02P 6/085 318/400.04 |
| 2011/0279975 A1* | 11/2011 | Shimizu | H02P 7/29 361/695 |
| 2014/0177165 A1* | 6/2014 | Ishii | H02P 7/29 361/679.48 |

* cited by examiner

MOTOR DRIVING CIRCUIT, COOLING APPARATUS AND ELECTRONIC DEVICE USING THE SAME

CROSS REFERENCE TO RELATED APPLICATIONS

The present invention claims priority under 35 U.S.C. § 119 to Japanese Application No. 2014-096314, filed May 7, 2014, the entire content of which is incorporated herein by reference.

FIELD OF THE INVENTION

The present invention relates to an electric motor driving device.

BACKGROUND

Present high-speed requirements for personal computers and workstations have forced an increase in operating speed of computational large scale integrated (LSI) circuits, such as central processing units (CPUs) or digital signal processors (DSPs). When the operating speed and the instant clock frequency of an LSI circuit increases, the thermal dissipation of the LSI circuit also increases. Accordingly, the LSI circuit or the peripheral circuits may fail to perform normal operations due to such thermal dissipation. Therefore, providing a proper cooling technique for the thermal dissipation of the LSI circuit is an urgent problem in this field.

An example for cooling an LSI circuit is a ventilation cooling method that implements cooling fans. According to the ventilation cooling method, the cooling fans can be installed on the opposite side of the surface of the LSI circuit, for example, so that the cooling fans can blow the cold air on the surface of the LSI circuit. During the cooling process of the LSI circuit, the ambient air temperature of the LSI circuit is monitored, and the rotating speed of the cooling fan can be adjusted in accordance with the monitored temperature that adjusts the cooling speed.

FIGS. 1A and 1B are the circuit diagrams illustrating the driving circuit of an electric fan motor and the peripheral circuits in accordance with the present invention. In FIGS. 1A and 1B, the driving integrated circuits (ICs) 200 have the same configuration but the peripheral circuits of the driving ICs 200 are different.

A power-supply pin 9 (i.e. VCC pin) is connected to an input supply voltage $V_{DD}$ via a diode D1 to prevent reverse current. In addition, the VCC pin 9 is connected to a zener diode ZD1 used for overvoltage protection and a capacitor C2 used for signal smoothing. A ground pin 14 is connected to the ground (i.e. GND). An output pin of an H bridge circuit 212 is connected to an electric fan motor 6 via a pin 6 (i.e. OUT2) and a pin 8 (i.e. OUT1). In addition, the pin on the lower part of the H bridge circuit 212 is connected to a pin 7 (i.e. $R_{NF}$). It is noted that the pin numerals are numbered for the sake of brevity, and is irrelevant to the layout of the pins. A control logic circuit 208 generates a pulse signal S1, and the pulse signal S1 is a pulse width modulated signal. A pre-driving circuit 210 switches the H bridge 212 according to the pulse signal S1.

The electric fan motor 6 is a brushless direct current (DC) electric motor. The driving IC 200 in combination with the peripheral circuit components are configured as a driving circuit for driving the electric fan motor 6 in PWM. A Hall sensor 8 is installed nearby the electric fan motor 6 for detecting the rotor position.

The Hall biasing circuit 204 generates a Hall bias voltage $V_{HB}$, and the Hall bias voltage $V_{HB}$ is supplied to the Hall sensor 8 via a pin 3. Hall signals H− and H+ generated by the Hall sensor 8 are supplied to a pin 2 and the pin 3 of the driving IC 200 respectively. A Hall comparator 202 compares the Hall signals H− and H+, and generates a pulse signal S2 indicating the rotor position to a control logic circuit 208. The control logic circuit 208 and the pulse signal S2 are arranged to synchronously change the driving phases of the H bridge circuit 212.

A resistor $R_{NF}$ is connected between the H bridge circuit 212 and the ground line $V_{SS}$. In other words, the resistor $R_{NF}$ is connected between pin 7 and a ground line. A detection voltage proportional to the current flowing to the electric fan motor 6 is generated across the resistor $R_{NF}$. A detection voltage $V_{NF}$ is supplied to a pin 5 via a resistor-capacitor (RC) filter. A current clamping comparator 206 compares the detection voltage $V_{NF}$ with a specific voltage Vc1. The voltage Vc1 determines the upper bound current flowing through the electric fan motor 6. If the output of the current clamp comparator 206 is determined to be a high voltage level, the control logic circuit 208 changes the logic value of the pulse signal S1 to stop flowing current to the electric fan motor 6.

An oscillator 220 generates a periodic carrier voltage OSC having a specific frequency. The carrier voltage OSC has a sawtooth waveform or a triangle waveform. A PWM comparator 216 compares a voltage $V_{MIN}$ on a pin 12 (i.e. MIN) with the carrier voltage OSC. The output of the PWM comparator 216 has a duty cycle corresponding to the voltage $V_{MIN}$ on the pin 12.

Similarly, a PWM comparator 218 compares a voltage $V_{TH}$ on a pin 11 (i.e. TH) with the carrier voltage OSC. The output of the PWM comparator 218 has a duty cycle corresponding to the voltage $V_{TH}$ on the pin 11.

The control logic circuit 208 combines the output pulses of the PWM comparators 216 and 218 in order to generate the pulse signal S1. The larger duty cycle in the output pulses of the PWM comparators 216 and 218 becomes the duty cycle of the pulse signal S1. In other words, the voltage on the pin 12 is used to set the lower bound of the duty cycle (i.e. the minimum duty cycle) of the pulse signal S1.

A reference voltage source 214 generates a specific reference voltage $V_{REF}$, and the specific reference voltage $V_{REF}$ is outputted to the external circuit via a pin 10 (i.e. REF). Resistors R11 and R12 divide the reference voltage $V_{REF}$ in order to generate a divided voltage on the input to the pin 12 (i.e. MIN). In other words, the voltage $V_{MIN}$ on the pin 12 can be set by the resistances of the external resistors R11 and R12. Thus, the minimum duty cycle of the pulse signal S1 can also be set.

The PWM input pin is arranged to input a PWM signal with the duty cycle corresponding to the target rotation number of the electric fan motor 6. In FIG. 1A, an input PWM signal is connected to the TH pin via an inverter 10.

In FIG. 1B, after an input PWM signal is inverted by an inverter 10, the inverted input PWM signal is smoothed by an RC filter 12, and is then inputted to the TH pin.

FIGS. 2A and 2B are timing diagrams illustrating the operating waveforms of the driving IC 200 in FIGS. 1A and 1B respectively.

Referring to FIG. 2A in conjunction with FIG. 1A, the operation of the driving IC 200 is described as follows.

The TH pin (i.e. pin 11) of the driving IC 200 of FIG. 1A is arranged to input the input pulse signal $V_{TH}$, wherein the input pulse signal $V_{TH}$ corresponds to the inverted input PWM signal. The high voltage level for the pulse signal $V_{TH}$ is higher than the peak value of the carrier voltage generated by the internal oscillator, and the low voltage level for the pulse signal $V_{TH}$ is lower than the valley value of the carrier voltage generated by the internal oscillator. By comparing the carrier voltage with the pulse voltage $V_{TH}$, the output pulse signal of the PWM comparator 218 has the same duty cycle as the duty cycle of the pulse voltage $V_{TH}$.

FIG. 2A shows the waveforms of H−>H+, the output OUT1 having the first phase is changed, and the output OUT2 having the second phase is fixed at the low voltage level. The switching duty cycle of the output OUT1 is the same as $V_{TH}$, and thus the switching duty cycle of the output OUT1 is the same as the duty cycle of the original input PWM signal. In addition, as $V_{MIN}$ equals to $V_{REF}$ and is higher than the peak value of the carrier voltage in this embodiment, the output of the PWM comparator 216 does not affect the output OUT1.

Therefore, when the PWM signal has a larger duty cycle, the torque (i.e. the rotation number) of the electric fan motor 6 is also higher.

In addition, referring to FIG. 2A in conjunction with FIG. 1B, the operation of the driving IC 200 is described as follows.

The TH pin (i.e. pin 11) of the driving IC 200 of FIG. 1B is arranged to input the DC voltage $V_{TH}$ after the DC voltage $V_{TH}$ is smoothed by a filter. When the output OUT1 equals the lower voltage of $V_{MIN}$ and $V_{TH}$, the output OUT1 has the duty cycle corresponds to the comparison result of the carrier voltage.

Therefore, when the PWM signal has a larger duty cycle, the torque (i.e. the rotation number) of the electric fan motor 6 is also higher. In addition, the smallest torque, i.e. the minimum rotation number, can be set by the voltage $V_{MIN}$.

Hence, according to the driving IC 200 in FIG. 1, the TH pin can be inputted by DC voltage, the TH pin can also be inputted by pulse signals. Therefore, the present embodiments provide a high flexibility of circuit components for the designer.

BACKGROUND TECHNICAL LITERATURE

Patent Literatures

[Patent literature 1] Japanese patent publication 2005-224100

[Patent literature 2] Japanese patent publication 2004-166429

BRIEF SUMMARY OF THE INVENTION

Problem to be Solved in the Present Invention

However, the driving IC 200 has the following problems.

In the platform of FIG. 1A, there are limitations for the high voltage level and low voltage level of the TH pin. That is, the high voltage level of the TH pin has to be higher than the peak value of the carrier voltage OSC, and the low voltage level has to be lower than the valley value of the carrier voltage OSC. As a result, the amplitude of the input pulse signal of the TH pin has to be carefully designed.

Moreover, the duty cycle (input duty cycle) of the input PWM signal is the same as the duty cycle of the output OUT1 (i.e. OUT2). Thus, the relation between input and output is fixed and unchangeable.

In the platform of FIG. 1B, the relation (i.e. slope) between the input duty cycle and the output duty cycle can be adjusted by using a filter 12. However, this will increase the number of components and the cost. Moreover, having a large number of components makes it difficult to minimize the device size.

In addition, the variation range of the DC voltage of the TH pin is the variation range of the output duty cycle. To improve the precision of the output duty cycle with respect to the DC voltage, the difference between the peak value and valley value, i.e., the amplitude, of the carrier voltage OSC should be larger. Therefore, the voltage source $V_{DD}$ is also higher.

Therefore, one of the objectives of the present embodiment is to provide an electric motor driving circuit with low cost, small area, and the relation between the input duty cycle and the output duty cycle is adjustable.

Technical Solution

According to an embodiment of the present invention, a driving circuit of an electric motor is provided. The driving circuit is applicable for driving an electric fan motor by pulse width modulation (PWM). The driving circuit comprises: a PWM input pin for externally receiving an input pulse modulation signal with an input duty cycle; a duty cycle to digital converter for receiving the input pulse modulation signal and converting the input pulse modulation signal into a first digital value corresponding to the input duty cycle; a slope setting pin for receiving information indicative of a slope of an output duty cycle corresponding to the input duty cycle of the electric motor driving circuit; a slope acquisition unit for acquiring a second digital value corresponding to the information indicative of the slope; a duty cycle computation unit for generating a linearly increased duty cycle instruction value corresponding to the first digital value by referring to the slope corresponding to the second digital value; a digital pulse width modulator for generating a controlling pulse having the output duty cycle corresponding to the duty cycle instruction value; and an output circuit for driving the electric fan motor in accordance with the controlling pulse.

According to the embodiment, the input pulse modulation signal is inputted to the PWM input pin via the duty cycle to digital converter. The slope of the output duty cycle in relation to an input duty cycle can be externally set via the slope setting pin and the slope acquisition unit. The arrangement can lower cost and area, and the relation between the input duty cycle and the output duty cycle can also be adjusted.

The slope setting pin receives an analog DC voltage indicative of the slope, and the slope acquisition unit comprises a first A to D converter for converting the analog DC voltage of the slope setting pin into the second digital value.

The slope setting pin receives a serial or parallel digital data indicative of the slope, and the slope acquisition unit comprises: an interface circuit for receiving the digital data; and a storage device for storing the second digital value corresponding to the digital data.

The slope setting pin receives a second digital value indicative of the slope, and the slope acquisition unit also comprises a non-volatile storage device storing the second digital value.

The electric fan motor driving circuit further comprises: a DC input pin, an analog DC input voltage, and a second analog to digital (A/D) converter that converts the DC voltage from the DC input pin to a third digital value. The duty cycle computation unit also clamps the duty cycle instruction value by using the third digital value as a lower bound.

Therefore, the lowest rotation number of the electric fan motor can be arbitrary controlled. Moreover, the electric fan motor driving circuit can also be used in the platform design that controls the rotation number by using an analog input DC voltage.

When setting the output duty cycle as OUTDUTY, setting the input duty cycle as INDUTY, setting the slope as SLP, setting the lower bound of the duty cycle instruction value as MIN, setting a parameter as OFS, and setting a maximal value selection function as max (F), the duty cycle computation unit computes the duty cycle instruction value in accordance with the following equation:

$$OUTDUTY=SLP \times max(INDUTY, MIN)+OFS$$

When setting the output duty cycle as OUTDUTY, setting the input duty cycle as INDUTY, setting the slope as SLP, sets the lower bound of the duty cycle instruction value as MIN, setting a parameter as OFS, and setting a maximal value selection function as max (F), the duty cycle computation unit computes the duty cycle instruction value in accordance with the following equation:

$$OUTDUTY=max(SLP \times INDUTY+OFS, MIN).$$

The parameter OFS can be obtained by the constant K in accordance with any of the following equations:

$$OFS=100 \times (K-SLP).$$

$$OFS=100 \times K.$$

$$OFS=100 \times (SLP-K).$$

The constant can also be set as K=1. The constant K can also be set external to the electric motor driving circuit.

The duty cycle to digital converter comprises: a voltage level converting circuit, after a value of the input pulse modulation signal is converted into a binary value comprising 1 and 0, the voltage level converting circuit multiplies the input pulse modulation signal comprised of the binary value by a factor of $2^L$, where L is a natural number; and a digital low-pass filter, for filtering an output data from the voltage level converting circuit and generating a first digital value.

The digital low-pass filter is a first order IIR (infinite impulse response) filter comprising an adder, a delay circuit, and a factor circuit orderly connected in series. The adder is arranged to add up the output data of the voltage level converting circuit and an output data of the delay circuit, and to subtract an output data of the factor circuit, the delay circuit delays an output data of the adder, and the factor circuit multiplies an output data of the delay circuit by a factor of $2^{-n}$, wherein n is a natural number.

The number n is determined by a method such that an amplitude of an output data of the factor circuit is less than 1.

The electric motor driving circuit can also be integrated onto a semiconductor substrate.

The term "integrated" means the required components of the circuit are formed on a semiconductor substrate, or the required components of the circuit are integrated into a single chip. A portion of resistors or capacitors can be installed external to the semiconductor substrate for adjusting the circuit parameters.

By integrating the circuits into a single IC, the size of the circuits can be reduced, and the characteristic of the circuit components can be kept intact.

According to another embodiment of the present invention, a cooling device is provided. The cooling device comprises an electric fan motor and any driving circuit of the above embodiments, for driving the electric fan motor.

According to another embodiment of the present invention, is electronic device. The electronic device comprises a processor and the above cooling device for cooling the processor.

In addition, those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Effects of the Present Invention

In accordance with the embodiment, the cost and chip area are reduced, and the relation between the input duty cycle and the output duty cycle is adjustable.

DETAILED DESCRIPTION

Figure 3:
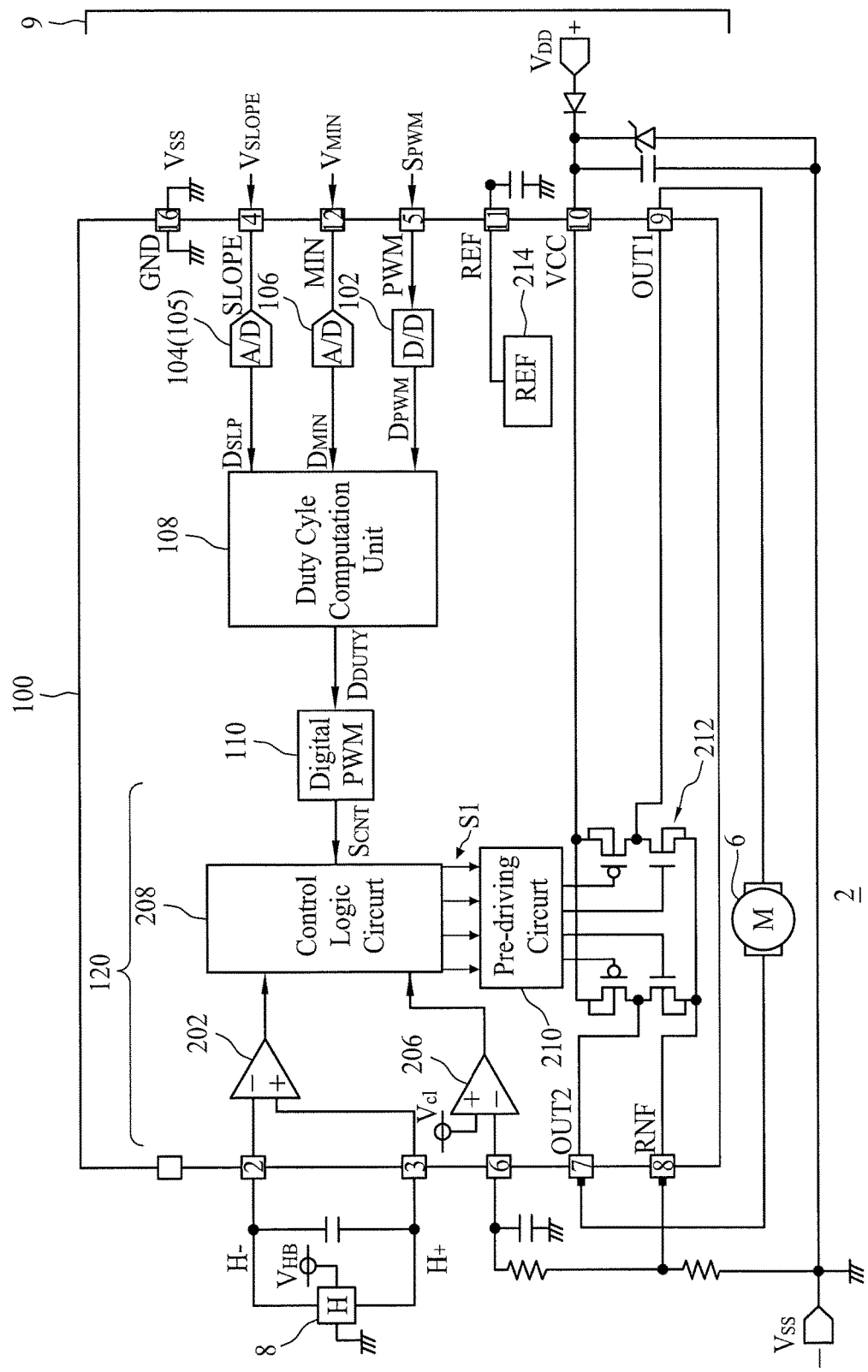
FIG. 3 is a diagram illustrating a cooling device comprising the driving IC in accordance with an embodiment of the present invention.

FIG. 3 is a diagram illustrating a cooling device 2 comprising the driving IC 100 in accordance with an embodiment. The cooling device 2 may be installed in devices, such as desktop PC, laptop notebook, workstation, gaming console, and audio device, and projecting device and so on, to cool down the CPU (Central Processing Unit), GPU (Graphics Processing Unit), and power supply, etc. The cooling device 2 comprises: an electric fan motor 6 installed opposite to the cooling target; and a driving device 9 for driving the electric fan motor 6.

According to the embodiments, the driving device 9 comprising the driving IC 100 and the peripheral components. The components of the driving device 9 are installed on a shared PCB (printed circuit board). FIG. 3 only includes a part of the peripheral components required in describing the operation of the driving IC 100.

The driving IC 100 comprising a duty cycle to digital converter 102, a slope acquisition unit 104, a second analog to digital converter 106, a duty computation unit 108, a digital pulse width modulator 110, an output circuit 120, and a reference voltage source 214, wherein all the components are integrated in an functional IC on a semiconductor substrate.

The power pin 10 (also called VCC pin) is inputted by an input supply voltage $V_{DD}$. The ground pin 16 (also called GND pin) is inputted by a ground voltage $V_{SS}$. The reference voltage source 214 generates a stabilized voltage having a specific voltage level $V_{REF}$, which is outputted on the reference voltage pin 11 (also called REF pin). The reference voltage $V_{REF}$ is used in the driving IC 100 and is also used in the external of the driving IC 100. Moreover pins 6-9 in FIG. 3 correspond to pins 5-8 in FIG. 1 respectively.

The duty cycle to digital converter 102, the slope acquisition unit 104, the second analog to digital converter 106, the duty cycle computation unit 108, and the digital pulse width modulator 110 are arranged to receive an input PWM signal $S_{PWM}$ which was pulse width modulated externally, and to generate a controlling pulse $S_{CNT}$ having a duty cycle (i.e. the output duty cycle OUTDUTY) corresponding to the duty cycle (i.e. the input duty cycle INDUTY) of the input PWM signal $S_{PWM}$.

The output circuit 120 drives the electric fan motor 6 in accordance with the controlling pulse $S_{CNT}$. In general, the present embodiment is arranged to alternatively select the outputs OUT1 and OUT2 according to the output of the Hall comparator 202 and to switch the output according to the controlling pulse $S_{CNT}$ at the same time.

The output circuit 120 comprising the Hall comparator 202, a current clamp comparator 206, a control logic circuit 208, a pre-driving circuit 210, an H bridge circuit 212, and a reference voltage source 214. The connection of the components can be referred to FIG. 1, and the detailed description is omitted here for brevity. Moreover, the implementation of the output circuit 120 is not limited to the implementation of FIG. 3, the output circuit 120 may have other configurations. In FIG. 3, the Hall sensor 8 is installed externally. However, the Hall sensor 8 may be installed in the driving IC 100.

The generating the controlling pulse $S_{CNT}$ is described as follows.

The PWM input pin 5 (i.e. the PWM pin) is arranged to externally receive an input pulse modulated signal $S_{PWM}$ having an input duty cycle INDUTY. The duty cycle to digital converter 102 receives the input pulse width modulation signal $S_{PWM}$ and converts the input pulse width modulation signal $S_{PWM}$ into a first digital value $D_{PWM}$ corresponding to the input duty cycle INDUTY.

The slope SLP of an output duty cycle OUTDUTY corresponding to the input duty cycle INDUTY of the driving IC 100 can be externally set. The slope setting pin 4 (also called SLOPE pin) is arranged to receive the information indicating the slope. The slope acquisition unit 104 receives the information indicative of the slope SLP and acquires a second digital value ($D_{SLP}$) corresponding to the slope SLP.

In this embodiment, the SLOPE pin is arranged to receive an analog DC input voltage $V_{SLOPE}$ having a voltage level corresponding to the slope SLP. Therefore, the slope acquisition unit 104 further comprises the first analog to digital converter 105 used for converting the DC voltage $V_{SLOPE}$ into a digital value.

For the example of the second analog to digital converter 106, when $V_{SLOPE}=V_{REF}$, then SLP=2, when $V_{SLOPE}=V_{REF}/2$, then SLP=1, and when $V_{SLOPE}=V_{REF}/4$, then SLP=1/2.

The duty cycle computation unit 108 generates a linearly increased duty cycle instruction value $D_{DUTY}$ corresponding to a first digital value $D_{PWM}$ by referring to the slope SLP corresponding to a second digital value $D_{SLP}$. The duty cycle instruction value $D_{DUTY}$ is the data indicating the output duty cycle OUTDUTY of the controlling pulse signal $S_{CNT}$. The digital pulse width modulator 110 generates the controlling pulse $S_{CNT}$ having the output duty cycle OUTDUTY corresponding to the duty cycle instruction value $D_{DUTY}$.

The operation of the duty cycle computation unit 108 is described as follows. For example the duty cycle computation unit 108 computes the value (i.e. the output duty cycle OUTDUTY) of the duty cycle instruction value $D_{DUTY}$ in accordance with equation (1):

$$\text{OUTDUTY}=\text{SLP}\times\text{INDUTY}+100\times(1-\text{SLP}) \quad (1)$$

In which, when the value of equation (1) is negative, OUTDUTY=0. It is noted that OUTDUTY≥0. The equation (1) can be calculated under the condition of 100% where INDUTY=100% and OUTDUTY=100%.

The driving IC 100 can be externally set the lowest rotation number of the electric fan motor 6. The DC input pin 12 (also called MIN pin) is arranged to receive the analog DC input voltage $V_{MIN}$. The second analog to digital converter 106 converts the second DC voltage $V_{MIN}$ into a third digital value $D_{MIN}$. The duty cycle computation unit 108 clamps the duty cycle instruction value $D_{DUTY}$ by using the third digital value $D_{MIN}$ as a lower bound.

In such case, the equation (2) can be obtained by directly amending the equation (1). MIN represents the minimum duty cycle of the digital value $D_{MIN}$:

$$\text{OUTDUTY}=\text{SLP}\times\max(\text{INDUTY, MIN})+100\times(1-\text{SLP}) \quad (2)$$

Max is a function for selecting the larger value of the INDUTY and MIN.

It is noted that the present invention is not limit to the implementation of the duty cycle computation unit Those skilled in the art are appreciated to understand that the duty cycle computation unit 108 can be implemented by a combination of product-sum arithmetic unit, multiplier, and adder, etc.

Figure 4:
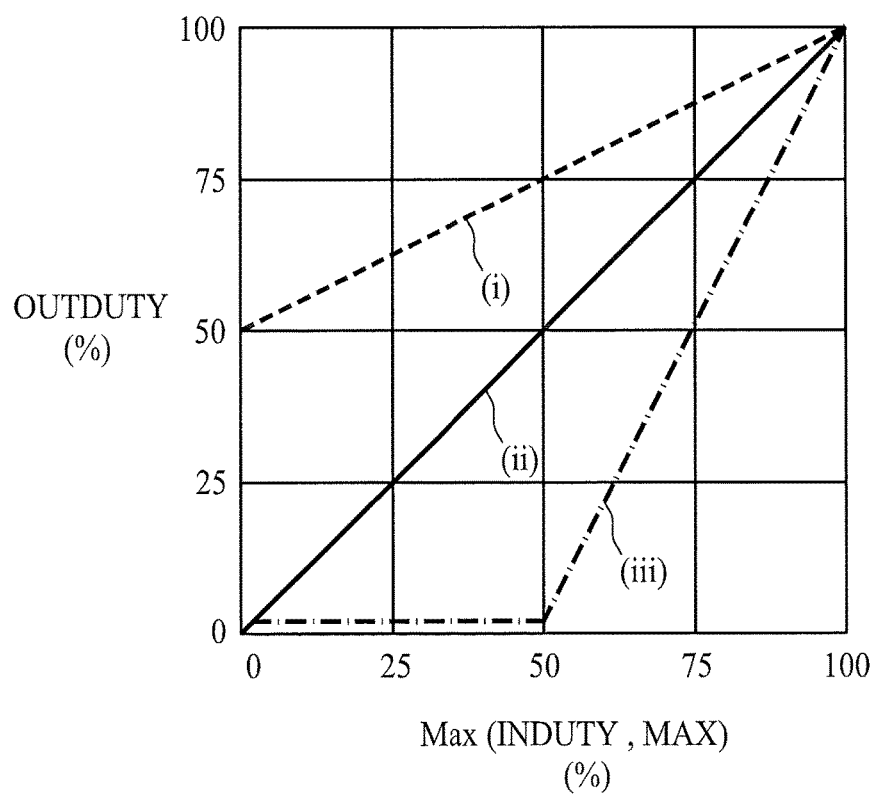
FIG. 4 is a diagram illustrating the relationship between the input and the output of a duty cycle computation unit in accordance with an embodiment of the present invention.

FIG. 4 is a diagram illustrating the relationship between the input and the output of the duty cycle computation unit 108. The horizontal axis represents the input duty cycle INDUTY, and the vertical axis represents the output duty cycle OUTDUTY. The curve (i) represents the characteristic when SLP=½, the curve (ii) represents the characteristic when SLP=1, and the curve (iii) represents the characteristic when SLP=2.

In addition, the input and output characteristics of the duty cycle computation unit 108 can be determined under the condition of 0% where INDUTY=0% and OUTDUTY=0%. The input and output characteristics of the duty cycle computation unit 108 can also be determined under the condition of 50% where INDUTY=50% and OUTDUTY=50%.

Figure 5:
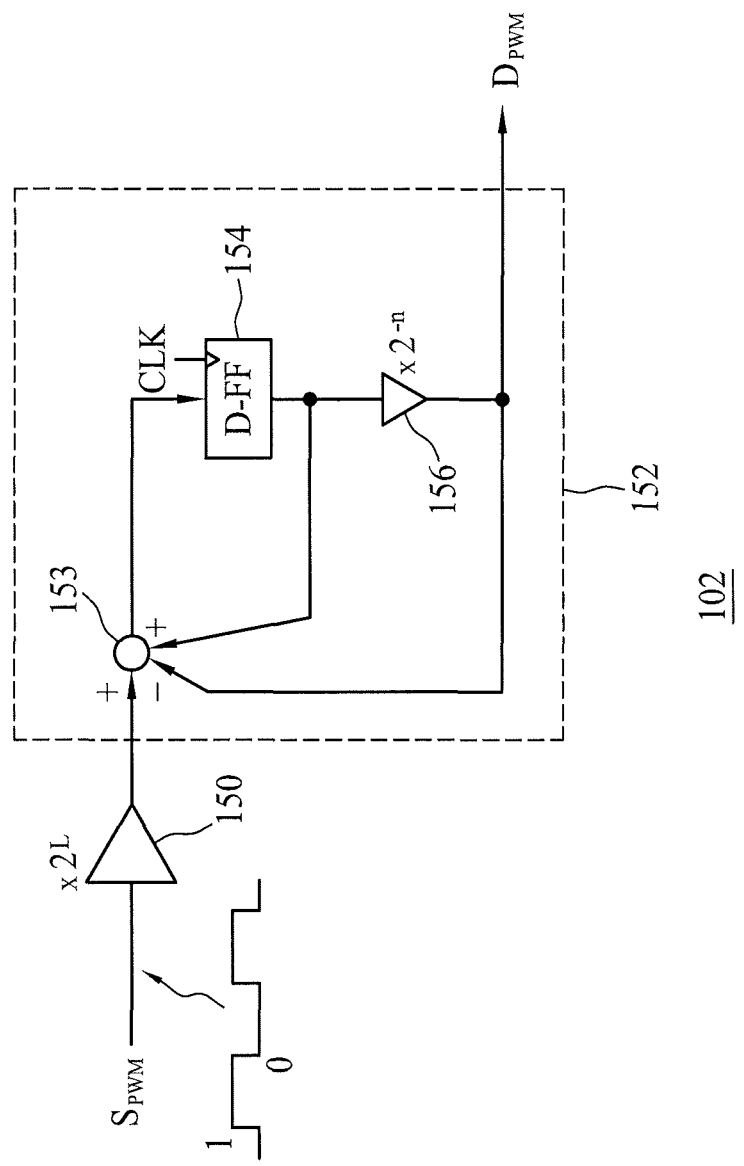
FIG. 5 is a circuit diagram illustrating a configuration of a duty cycle to digital converter in accordance with an embodiment of the present invention.

FIG. 5 is a circuit diagram illustrating a configuration of the duty cycle to digital converter 102. The duty cycle to digital converter 102 comprises a voltage level switching circuit 150 and a digital filter 152.

The high level of the input PWM signal $S_{PWM}$ is set to 1, and the low level is set to 0. Therefore, the input PWM signal $S_{PWM}$ can be inputted to the input pin of the CMOS (Complementary Metal Oxide Semiconductor). The voltage level switching circuit 150 multiplies the input PWM signal being converted to 1 and 0 by a factor $2^L$. When L=7, the values of 1 and 0 of the input PWM signal $S_{PWM}$ are converted to the values of 128 and 0 respectively, and then are transmitted to the subsequent digital filter 152.

The digital filter 152 is a first order IIR (infinite impulse response) low-pass filter comprising an adder 153, a delay circuit 154, and a factor circuit 156 orderly connected in series.

The delay circuit 154 has a bit width of (L+n), the delay circuit 154 is arranged to synchronously delay the output data of the adder circuit 153 by a delay time $T_{clk}$ according to the clock signal CLK having a period of $T_{clk}$.

The adder 153 multiplies the output data of the delay circuit 154 by a factor of $2^{-n}$. The constant n is used to determine the frequency response of the low-pass filter. The adder 153 and the factor circuit 156 further comprise a bit shifter that shifts the input data to the right by n bits.

The adder 153 is arranged to add up the output data of the voltage level converting circuit 150 and an output data of the delay circuit 154, and to subtract an output data of the factor circuit 156. The computing result is then outputted to the delay circuit 154.

Figure 6A:
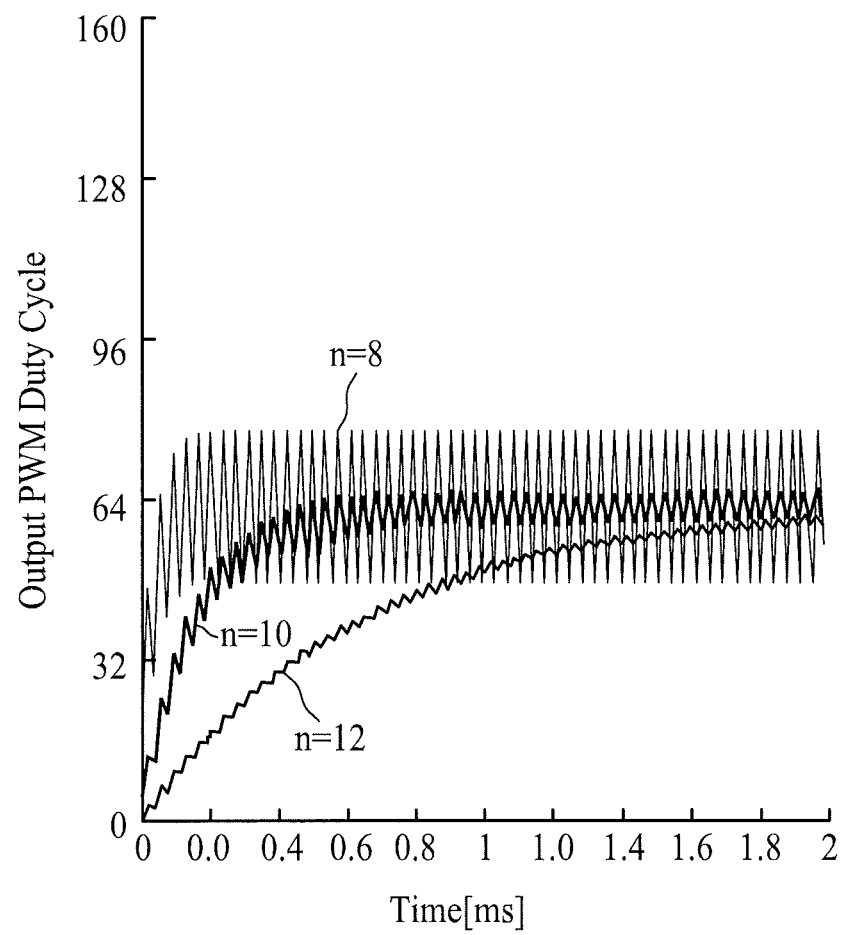
FIGS. 6A and 6B are diagrams illustrating an operation of a PWM duty cycle to digital converter in FIG. 5 in accordance with some embodiments of the present invention.
Figure 6B:
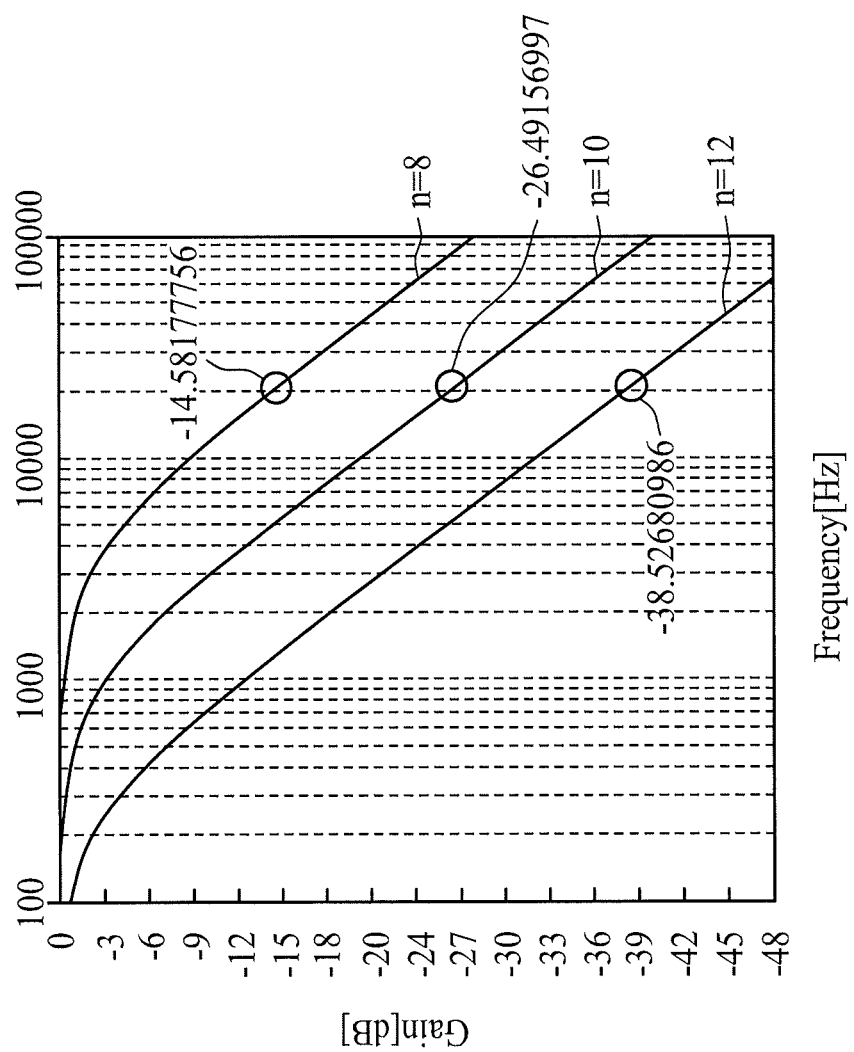

FIGS. 6A and 6B are diagrams illustrating the operation of the PWM duty cycle to digital converter in FIG. 5. FIG. 6A represents the first digital value $D_{PWM}$ when the input signal PWM has a duty cycle of 50%. The response gain and the amplitude change of the feedback loop can be adjusted by changing the value of n.

The frequency fax of the clock signal CLK is described in this paragraph. When the duty cycle of the input PWM signal $S_{PWM}$ is controlled by L bits, it is better to use the precision level capable of converting the value smaller than $\frac{1}{2^L}$ to convert the input PWM signal $S_{PWM}$. For example, when the duty cycle is converted by L=7 bits (i.e. 0 to 127), the precision level should be under $\frac{1}{128} \approx 1\%$. Therefore, when the carrier frequency $f_{PWM}$ of the input PWM signal $S_{PWM}$ is 28 KHz, and the frequency $f_{CLK}$ of the clock signal CLK is 3.6 MHz, i.e. $2^L$ (i.e. 128) times higher than 28 KHz, then no data will be missed. Accordingly, a first digital value $D_{PWM}$ can be generated in each cycle of the input PWM signal. Therefore, the frequency splitting can be avoided.

The factor n of the filtering process is described in this paragraph. FIG. 6B is a diagram illustrating the low-pass filtering characteristic of the duty cycle to digital converter 102. In order to limit the amplitude of the first digital value $D_{PWM}$ to fall within one pitch, the target gain G should be G=$\frac{1}{128}$=−42 dB. When n=12, and when the carrier frequency $f_{PWM}$ of the input signal PWM is 21 KHz, a filtering rate of −38.5 dB can be achieved. If the carrier frequency $f_{PWM}$ is higher, then a filtering rate smaller than −42 dB can be achieved.

The above paragraphs have described the configuration of the driving IC 100. The operation of the driving IC 100 is described in the following paragraphs.

Figure 7A:
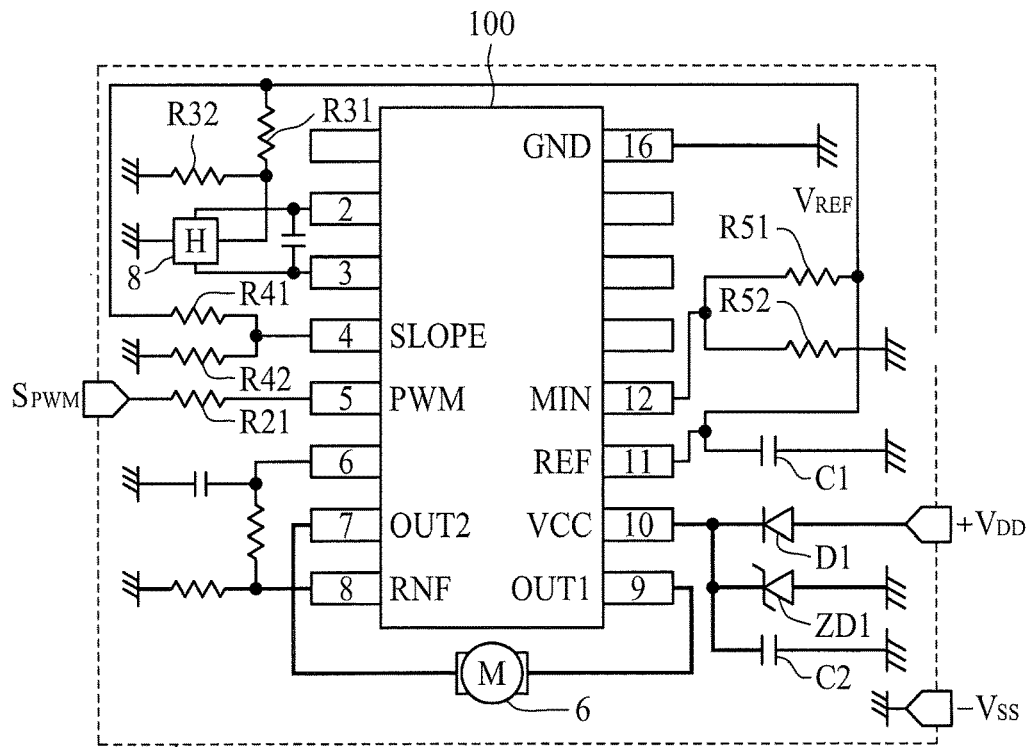
FIGS. 7A and 7B are circuit diagrams illustrating cooling devices applied in different platforms respectively in accordance with some embodiments of the present invention.
Figure 7B:
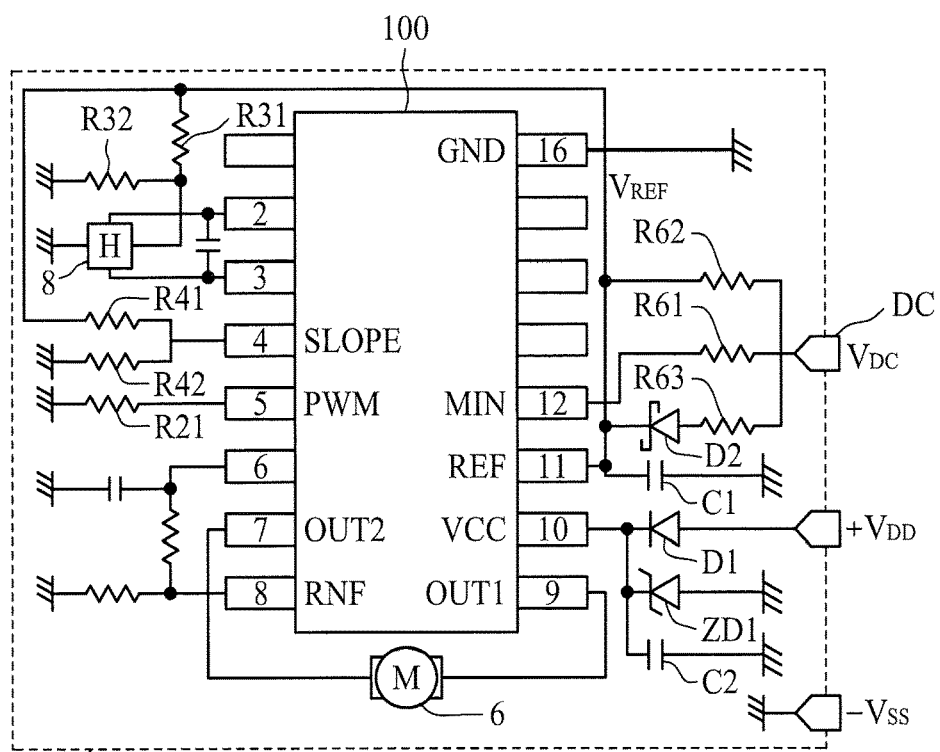

The driving IC 100 can be used to control a variety of different platforms. FIGS. 7A and 7B are circuit diagrams illustrating the cooling devices 2 applied in different platforms respectively. The peripheral circuits of the cooling devices 2 are different in FIGS. 7A and 7B.

The platform in FIG. 7A is first described. In the cooling device 2a of the first platform, the input PWM signal $S_{PWM}$ generated by a CPU or a microprocessor external to the driving IC 100 is inputted to the PWM pin (i.e. pin 5) via the resistor R21.

The VCC pin is connected to the input supply voltage $V_{DD}$ via a diode D1 to prevent reverse current. In addition, the VCC pin is connected to a zener diode ZD1 used for overvoltage protection and a capacitor C2 used for signal smoothing.

The REF pin (i.e. pin 11) is connected to the smoothing capacitor C11. The output reference voltage $V_{REF}$ is generated at the REF pin by the internal reference voltage source 214. The resistors R31 and R32 are arranged to divide the reference voltage $V_{REF}$ on the REF pin to generate the Hall bias voltage $V_{HB}$ of the Hall-effect transducer 8.

Resistors R41 and R42 are arranged to divide the reference voltage $V_{REF}$ to generate a divided voltage to the SLOPE pin (i.e. pin 4). Resistors R51 and R52 are arranged to divide the reference voltage $V_{REF}$ to generate a divided voltage to the MIN pin (i.e. pin 12).

The above paragraphs have described the configuration of the cooling device 2a.

According to the cooling device 2a, the slope of input and output characteristics in FIG. 4 can be arbitrarily set by the voltage dividing ratio of the resistors R41 and R42. Moreover, the minimum rotation number of the electric fan motor 6 can be arbitrarily set by the voltage dividing ratio of the resistors R51 and R52.

Figure 1A:
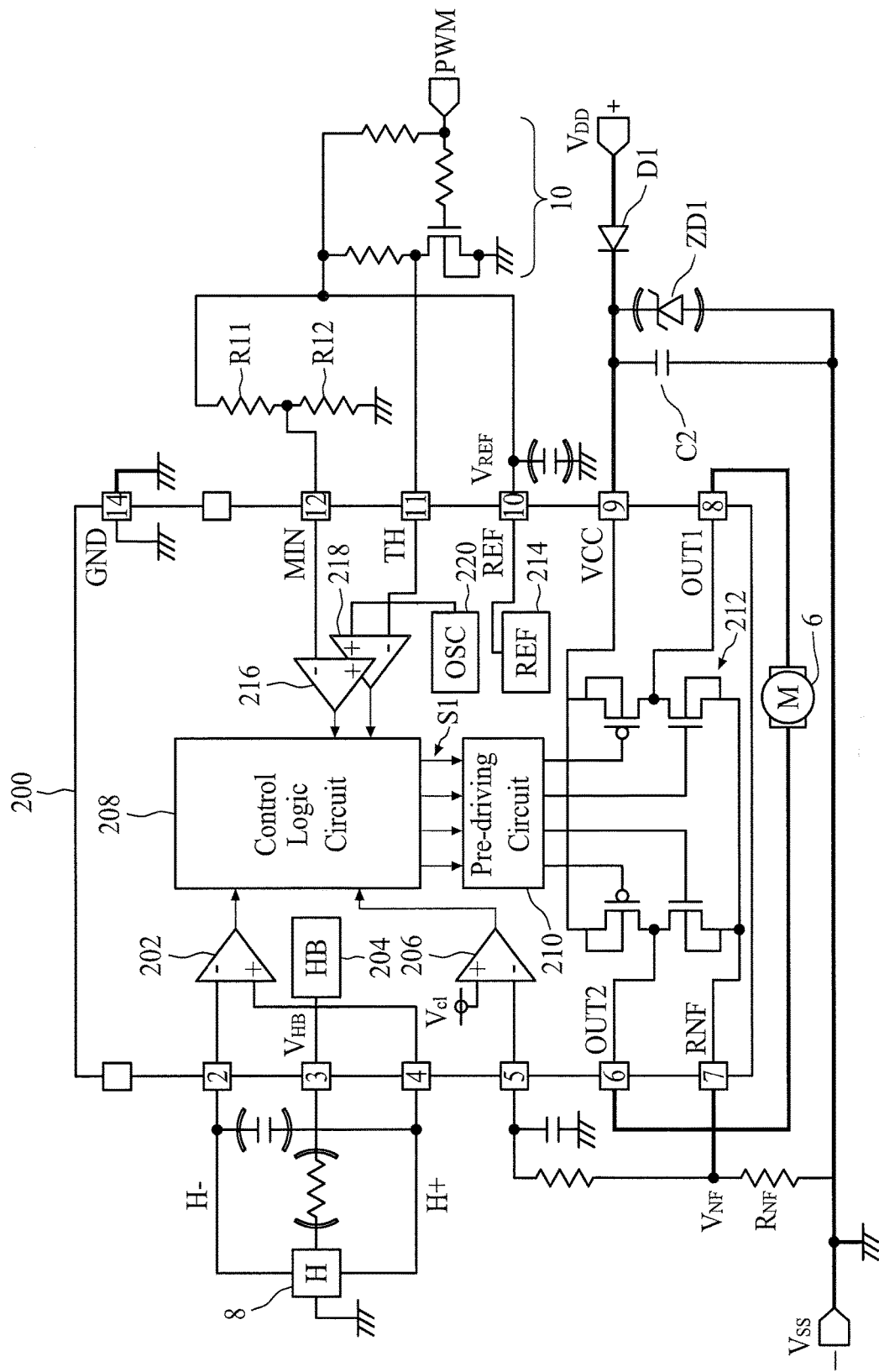
FIGS. 1A and 1B are the circuit diagrams illustrating driving circuits of electric fan motors and peripheral circuits in accordance with some embodiments of the present invention.
Figure 1B:
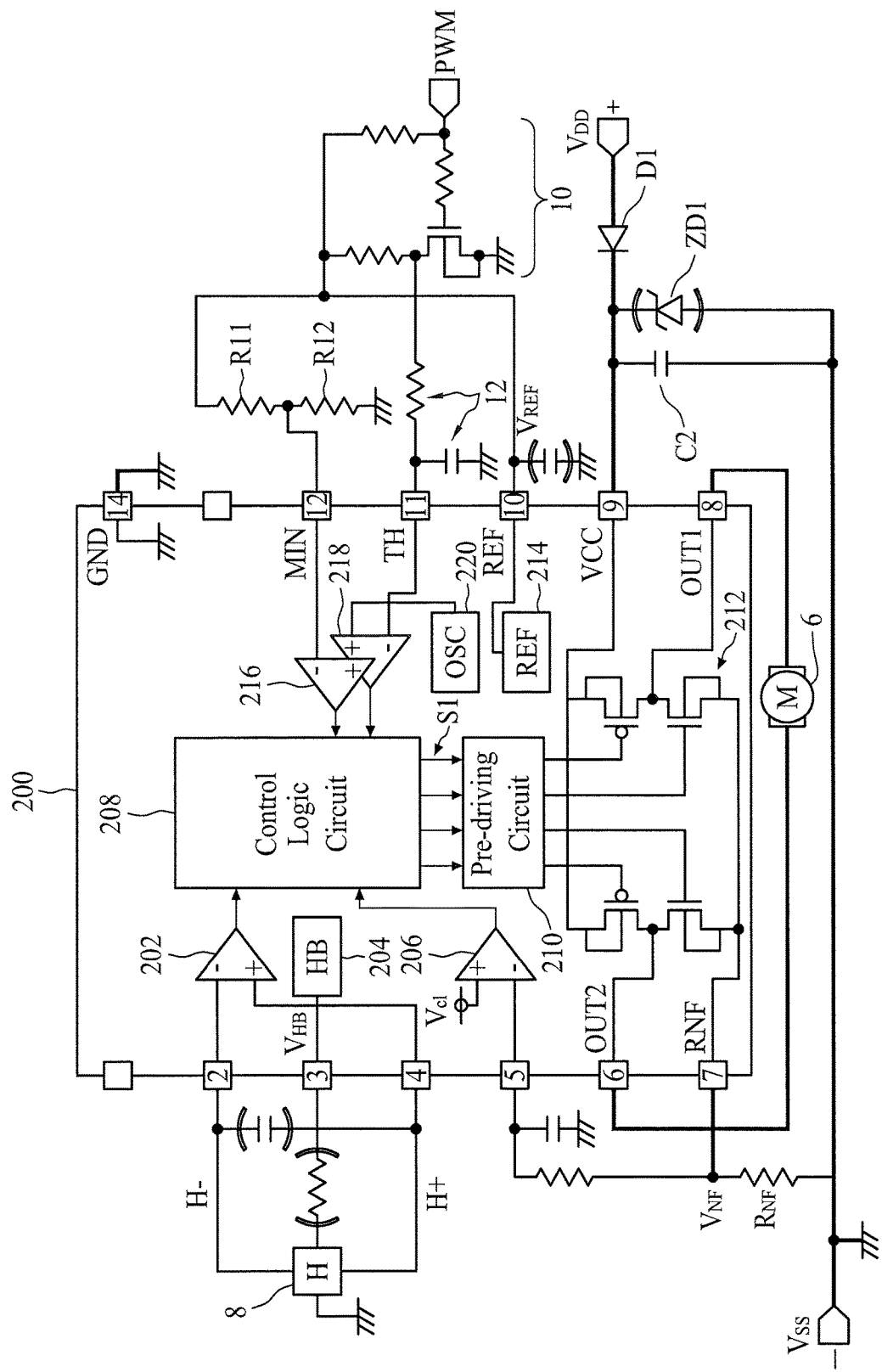
Figure 2A:
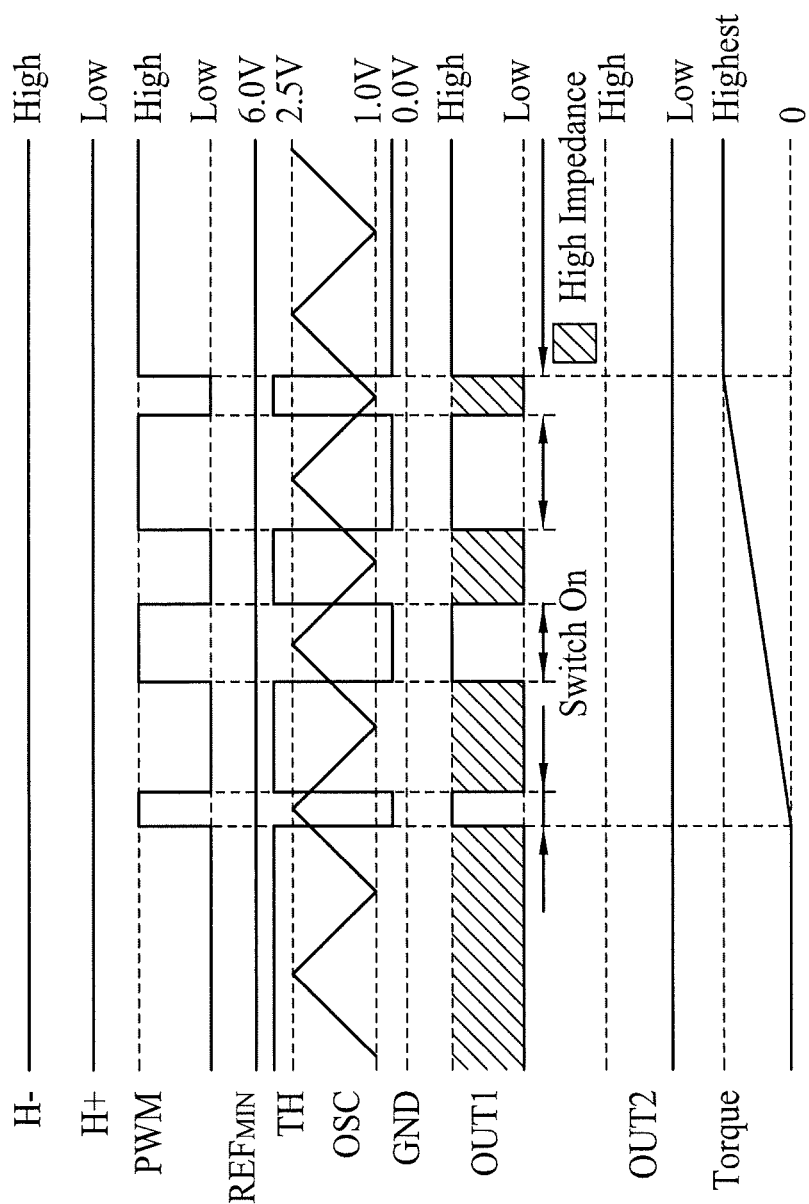
FIGS. 2A and 2B are timing diagrams illustrating the operating waveforms of the driving IC in FIGS. 1A and 1B respectively in accordance with some embodiments of the present invention.
Figure 2B:
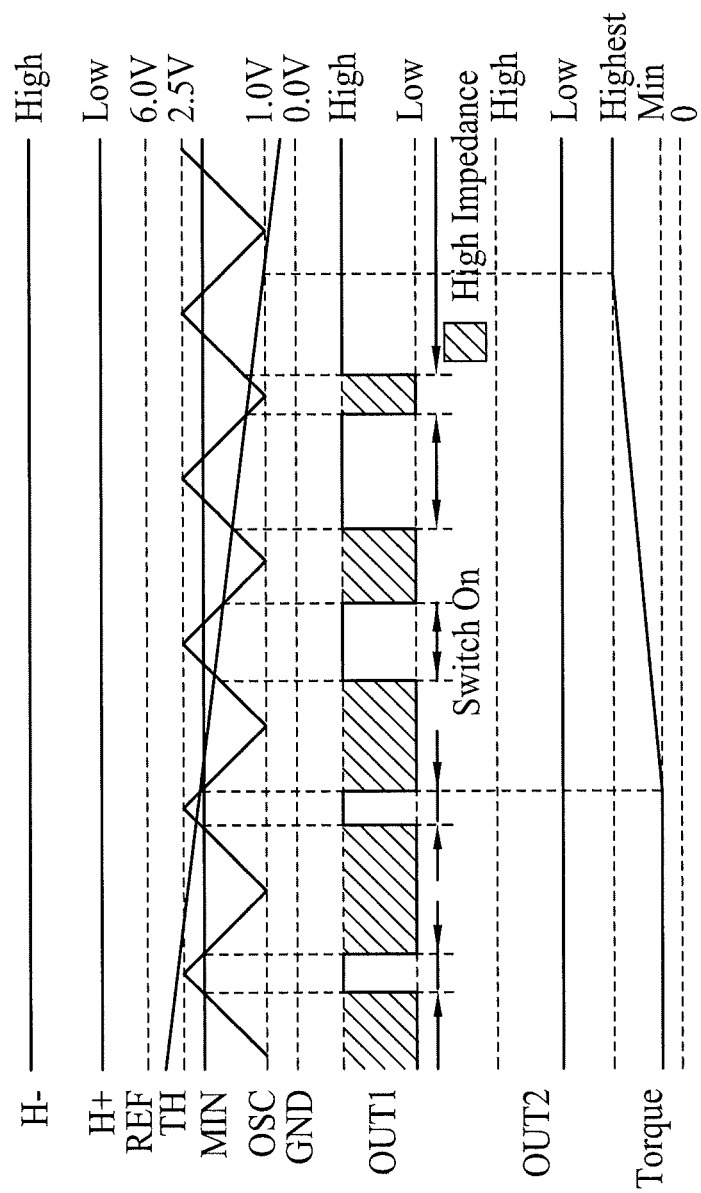

The benefit of the cooling device 2a becomes obvious by comparing the FIGS. 1A and 1B. As shown in FIG. 1A, the interface circuit used for receiving the input PWM signal requires an inverter 10. As shown in FIG. 1B, the interface circuit used for receiving the input PWM signal requires an inverter 10 and a low-pass filter 12. Furthermore, in the cooling device 2a of FIG. 7A, the interface circuit requires only the resistor R21, therefore the required components of the circuit can be reduced significantly.

In the platform of FIG. 1A, the high voltage level and low voltage level inputted to the TH pin are limited. However, in FIG. 7A, the amplitude of the input PWM signal $S_{PWM}$ is not limited.

In the platform in FIG. 1B, the variation range of the DC voltage on the TH pin corresponds to the variation range of the output duty cycle. To increase the accuracy of the output duty cycle with respect to the DC voltage, the difference between the peak value and the valley value, i.e., the amplitude, of the carrier voltage OSC should be larger. Therefore, the voltage source $V_{DD}$ is also higher On the other hand, in the platform of FIG. 7A, the duty cycle INDUTY of the input PWM signal is directly converted into a digital value by the duty cycle to digital converter 102, and the pulse width modulated control signal $S_{CNT}$ is generated in the digital domain. Thus, there is no need to increase the power source voltage $V_{DD}$, and the power consumption can be reduced.

In addition, in the embodiment of the driving IC100, the rotation number corresponding to the analog DC voltage can also be controlled. In the platform of FIG. 7B, the DC pin is arranged to externally receive the analog input DC voltage $V_{DC}$ indicative of the rotation number of the electric fan motor 6.

The input DC voltage $V_{DC}$ is inputted to the MIN pin via the resistor R61. The resistor R62 is installed between the REF pin and the DC pin. A diode D2 and a resistor R63 are serially connected between the REF pin and the DC pin for clamping the voltage on the MIN pin. In this platform, the PWM pin is connected to the ground via the resistor R21.

The above paragraphs describe the configuration of the cooling device 2b as shown in FIG. 7B. In the cooling device 2b, the PWM pin is connected to the ground. Therefore, the output $D_{PWM}$ of the duty cycle to digital converter 102 is zero. In addition, the output $D_{MIN}$ of the second analog to digital converter 106 is obtained by converting the input DC voltage $V_{DC}$ to a digital value. Therefore, given that $D_{MIN} > D_{PWM}$, and MIN>INDUTY in equation (2), the following equation (3) can be obtained:

OUTDUTY=SLP×MIN+100×(1−SLP)　　(3)

Accordingly, in the cooling device 2b in FIG. 7(b), the rotation number of the electric fan motor 6 can be controlled by the input DC voltage $V_{DC}$.

Therefore, the driving IC100 in the embodiment can be used in a platform that controls the rotation according to the PWM signal, and can be used in a platform that controls the rotation according to the DC voltage. In other words, the driving IC 100 provides the users with the freedom of selectively controlling different platforms.

Figure 8:
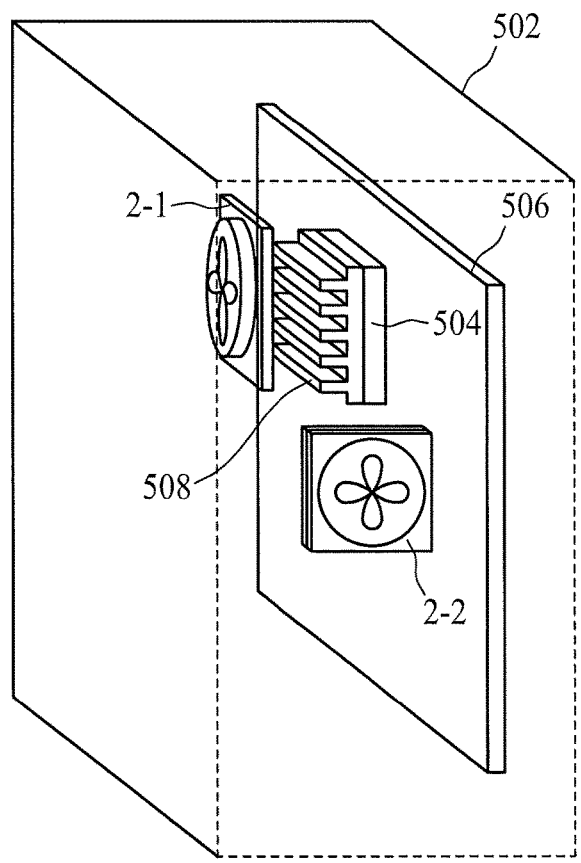
FIG. 8 is a diagram illustrating a sectional view for a PC comprising a cooling device in accordance with an embodiment of the present invention.

The application of the cooling device 2 is described in the following paragraphs. FIG. 8 is a diagram illustrating a sectional view for a PC comprising a cooling device 2. The PC 500 comprises a housing 502, a CPU 504, a motherboard 506, a heat sink 508, and a plurality of cooling devices 2.

The CPU 504 is installed on the motherboard 506. The heat sink 508 is securely installed onto the upper surface of the CPU 504. A cooling device 2-1 is installed opposite to the heat sink 508 and circulates cool air onto the heat sink 508. The cooling device 2-2 is installed on the back side of the housing 502, and circulates air to the inside of the housing 502 from the outside.

In addition to the PC500 of FIG. 8, the cooling device 2 can also be used in a workstation, a laptop notebook, a TV set, a refrigerator, or other electronic equipment.

The foregoing outlines features of several embodiments so that those skilled in the art may better understand the aspects of the present disclosure. Those skilled in the art should understand the given embodiment is exemplary. Other alternative embodiments can be formed with different combinations of the consisting elements and/or processes. Those alternative embodiments do not depart from the spirit and scope of the present disclosure.

A first alternative embodiment is as follows. The minimum rotation number for an electric fan motor 6 which is determined by equation (2) has been described in the above embodiment. However, the present invention is not limited to the above embodiment. A more generalized equation (2a) can also be applied as follows:

OUTDUTY=SLP×max(INDUTY, MIN)+OFS　　(2a)

OFS is a parameter, and the parameter OFS can be determined by a constant K in conjunction with one of the following equations (4a)~(4c).

OFS=100×(K−SLP)　　(4a)

OFS=100×K　　(4b)

OFS=100×(SLP−K)　　(4c)

The constant K can be set by a serial or a parallel interface, or externally set by the input pin of the driving IC 100. The constant K can also be a fixed value. In addition, the equation (2) is the same as the equation (4a) under the condition of K=1.

A second alternative embodiment is as follows. The minimum rotation number for an electric fan motor 6 which is determined by equation (2) has been described in the above embodiment. However, the present invention is not limited to the above embodiment. An equation (5) can also be applied as follows:

OUTDUTY=max(SLP×INDUTY+OFS, MIN)　　(5)

OFS can be obtained by one of the above equations (4a)~(4c). Equation (2) can be understood as clamping the input duty cycle INDUTY by using MIN as the lower bound. Therefore, equation (5) can be understood as clamping the output duty cycle OUTDUTY by using MIN as the lower bound.

A third alternative embodiment is as follows. The driving of the electric fan motor as a single-phase driving electric motor has been described in the above embodiment. However, the present invention is not limited to the above embodiment. The present invention can be applied for driving other type of electric motors.

Figures 9A, 9B:
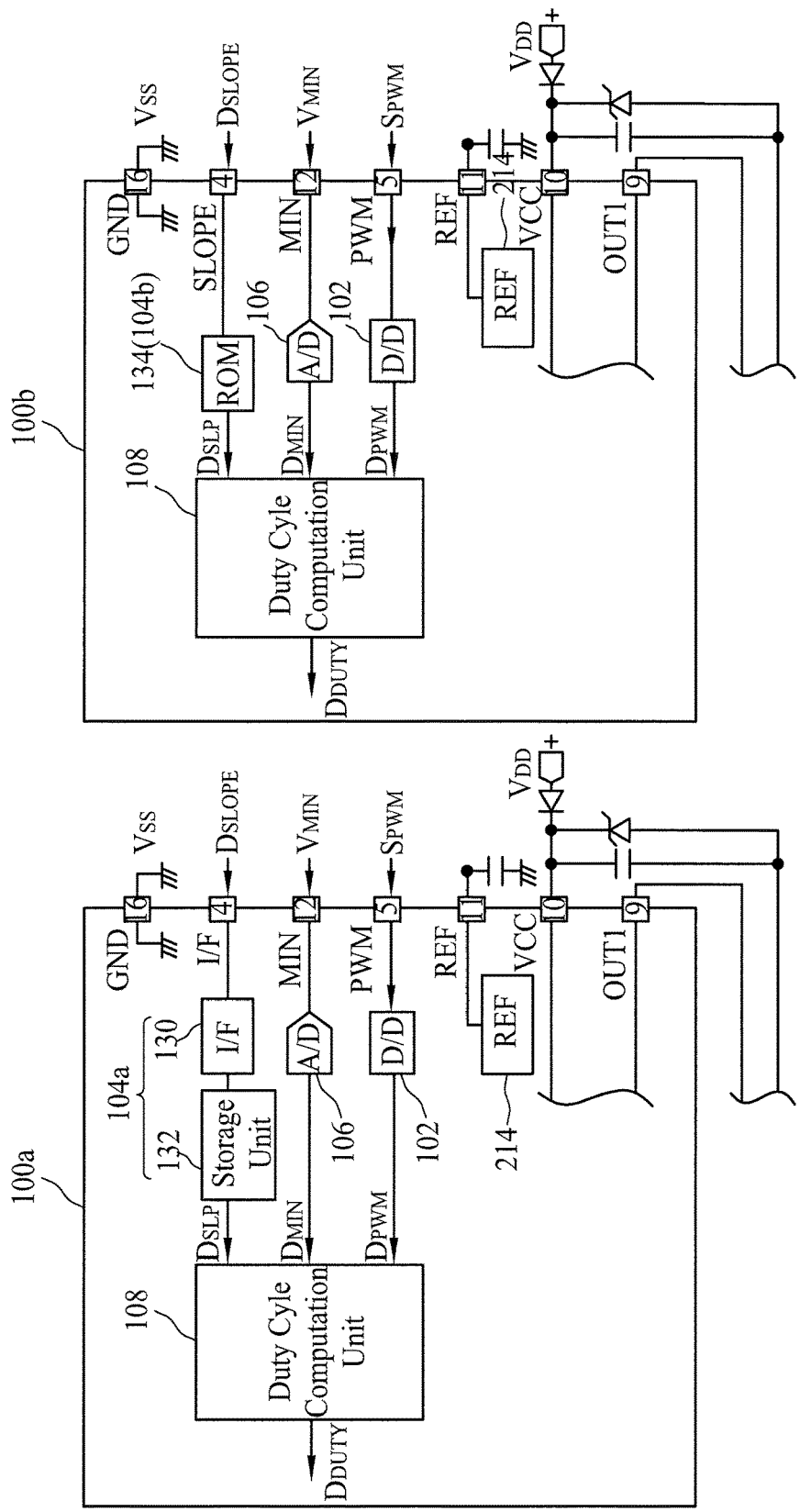
FIGS. 9A and 9B are circuit diagrams illustrating a partial of the driving ICs in accordance with the fourth alternative embodiment of the present invention.

A fourth alternative embodiment is as follows. The configuration of inputting the analog DC voltage to the SLOPE pin has been described in the above embodiment. However, the present invention is not limited to the above embodiment. The SLOPE pin can also be inputted by a digital data indicative of the information of the slope. FIGS. 9A and 9B are circuit diagrams illustrating a partial of the driving IC in accordance with the fourth alternative embodiment.

The driving IC 100a in FIG. 9A comprises one of the serial interface, such as an I²C (Inter IC) interface. In such case, the interface pin (I/F, interface), which is connected to the serial bus, is the SLOPE pin. In addition to other input data, the pin is also arranged to receive the serial digital data $D_{SLOPE}$ indicative of the slope SLP. In the driving IC100, the slope acquisition unit 104a comprises an interface circuit 130 and a storage circuit 132. The interface circuit 130 receives the digital data $D_{SLOPE}$ indicative of the slope SLP. The storage circuit 132 is a buffer device for storing the second digital value $D_{SLP}$ corresponding to the digital value. It is noted that the serial interface can also be replaced with the parallel interface.

The driving IC 100b in FIG. 9B comprises a non-volatile storage device that can be externally accessed. The SLOPE pin is arranged to receive the digital data $D_{SLOPE}$ indicative of the slope SLP. In such case, the slope acquisition unit 104b can be implemented by the non-volatile storage device 134. The non-volatile storage device 134 is a writable ROM (Read Only Memory) for storing the second digital value $D_{SLP}$ received by the SLOPE pin. The non-volatile storage device 134 can also be an OTP (One Time Programmable) ROM (Read Only Memory) that can be programmed by software, or an EEPROM (Electrically Erasable Programmable Read-Only Memory), etc.

A fifth alternative embodiment is as follows. The components of the driving IC 100 can be integrated into an integrated circuit, or separated into different integrated circuit blocks. Furthermore, some components of the driving IC 100 can be discrete circuits. The integration degree of the circuits is depended on the cost, circuit area, or functionality, etc.

What is claimed is:

1. A driving circuit of an electric motor, applicable for driving an electric fan motor by PWM (Pulse Width Modulation), the driving circuit comprising:

a PWM input pin, for externally receiving an input pulse modulation signal with an input duty cycle;

a duty cycle to digital converter, for receiving the input pulse modulation signal and converting the input pulse modulation signal into a first digital value corresponding to the input duty cycle;

a slope setting pin, for receiving information indicative of a slope of an output duty cycle corresponding to the input duty cycle of the electric motor driving circuit;

a slope acquisition unit, for acquiring a second digital value in response to the information indicative of the slope;

a duty cycle computation unit, for generating a linearly increased duty cycle instruction value corresponding to the first digital value by referring to the slope corresponding to the second digital value;

a digital pulse width modulator, for generating a controlling pulse having the output duty cycle corresponding to the duty cycle instruction value; and an output circuit, for driving the electric fan motor in accordance with the controlling pulse, wherein the slope setting pin further receives an analog DC voltage indicative of the slope, and the slope acquisition unit comprises a first A to D converter for converting the analog DC voltage of the slope setting pin into the second digital value.

2. The electric motor driving circuit of claim 1, further comprising:

a DC input pin, for receiving an analog DC voltage; and a second A to D converter, for converting the analog DC voltage of the DC input pin into a third digital value; and the duty cycle computation unit sets the third digital value as a lower bound to clamp the duty cycle instruction value.

3. The electric motor driving circuit of claim 2, wherein:

when the duty cycle computation unit sets the output duty cycle as OUTDUTY, sets the input duty cycle as INDUTY, set the slope as SLP, sets the lower bound of the duty cycle instruction value as MIN, set a parameter as OFS, and sets a maximal value selection function as max(F), the duty cycle computation unit computes the duty cycle instruction value by the following equation:

OUTDUTY=SLP×max(INDUTY, MIN)+$OFS$.

4. The electric motor driving circuit of claim 2, wherein:

when the duty cycle computation unit sets the output duty cycle as OUTDUTY, sets the input duty cycle as INDUTY, sets the slope as SLP, set the lower bound of the duty cycle instruction value as MIN, sets a parameter as OFS, and sets a maximal value selection function as max(F), the duty cycle computation unit computes the duty cycle instruction value by the following equation:

OUTDUTY=max(SLP×INDUTY+$OFS$, MIN).

5. The electric motor driving circuit of claim 3, wherein: the parameter OFS is determined by a constant K and the following equations:

$OFS$=100×($K$−SLP).

6. The electric motor driving circuit of claim 3, wherein: the parameter OFS is determined by a constant K and the following equation:

$OFS$=100×$K$.

7. The electric motor driving circuit of claim 3, wherein: the parameter OFS is determined by a constant K and the following equation:

$OFS$=100×(SLP−$K$).

8. The electric motor driving circuit of claim 5, wherein:

$K$=1.

9. The electric motor driving circuit of claim 5, wherein: the constant K is set external to the electric motor driving circuit.

10. The electric motor driving circuit of claim 1, wherein the duty cycle to digital converter comprises:

a voltage level converting circuit, after a value of the input pulse modulation signal is converted into a binary value comprising 1 and 0, the voltage level converting circuit multiplies the input pulse modulation signal comprised of the binary value by a factor of 2L, wherein L is a natural number; and a digital low-pass filter, for filtering an output data of the voltage level converting circuit to generate the first digital value.

11. The electric motor driving circuit of claim 10, wherein:

the digital low-pass filter is a first order IIR (infinite impulse response) filter, the first order IIR filter comprises an adder, a delay circuit, and a factor circuit, and the adder, the delay circuit, and the factor circuit are orderly connected in series, the adder is arranged to add up the output data of the voltage level converting circuit and an output data of the delay circuit, and to subtract an output data of the factor circuit, the delay circuit delays an output data of the adder, and the factor circuit multiplies an output data of the delay circuit by a factor of $2^{-n}$, wherein n is a natural number.

12. The electric motor driving circuit of claim 11, wherein:

n is determined by a method such that amplitude of an output data of the factor circuit is less than 1.

13. The electric motor driving circuit of claim 1, wherein: the electric motor driving circuit is integrated into a semiconductor substrate.

14. A cooling device, comprising:

an electric fan motor; and the electric motor driving circuit of claim 1, for driving the electric fan motor.

15. An electronic device, comprising:

a processor; and the cooling device of claim 14, for cooling the processor.

* * * * *